(12) United States Patent
Yan et al.

(10) Patent No.: US 11,646,233 B2
(45) Date of Patent: May 9, 2023

(54) METHOD FOR MANUFACTURING FIN FIELD-EFFECT TRANSISTOR

(71) Applicant: SHANGHAI HUALI INTEGRATED CIRCUIT CORPORATION, Shanghai (CN)

(72) Inventors: Tiancai Yan, Shanghai (CN); Bingxun Su, Shanghai (CN)

(73) Assignee: SHANGHAI HUALI INTEGRATED CIRCUIT CORPORATION, Shanghai (CN)

(*) Notice: Subject to any disclaimer, the term of this patent is extended or adjusted under 35 U.S.C. 154(b) by 103 days.

(21) Appl. No.: 17/199,331

(22) Filed: Mar. 11, 2021

(65) Prior Publication Data

US 2021/0391221 A1 Dec. 16, 2021

(30) Foreign Application Priority Data

Jun. 11, 2020 (CN) .......................... 202010531165.7

(51) Int. Cl.
*H01L 21/8234* (2006.01)
*H01L 21/76* (2006.01)
*H01L 29/66* (2006.01)

(52) U.S. Cl.
CPC ........... *H01L 21/823431* (2013.01); *H01L 21/823481* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2016/0190130 A1* | 6/2016 | Yu | H01L 21/823431 438/283 |
| 2020/0058652 A1* | 2/2020 | Park | H01L 29/0649 |
| 2020/0211859 A1* | 7/2020 | Qing | H01L 21/823828 |
| 2020/0328121 A1* | 10/2020 | Yao | H01L 21/823418 |
| 2020/0343144 A1* | 10/2020 | Li | H01L 21/823481 |
| 2020/0402838 A1* | 12/2020 | Gu | H01L 21/76224 |

* cited by examiner

*Primary Examiner* — Joseph C. Nicely
*Assistant Examiner* — Lamont B Koo
(74) *Attorney, Agent, or Firm* — Alston & Bird LLP

(57) ABSTRACT

The present application provides a method for manufacturing a fin field-effect transistor, comprising steps of: forming a plurality of strip fins and dummy gates on a substrate, wherein side walls are formed on both sides of the dummy gate; forming a source or a drain on the plurality of strip fins; depositing an interlayer dielectric layer, and performing chemical mechanical planarization (CMP) on the interlayer dielectric layer to expose the top surfaces of the dummy gates; forming a single diffusion break in a single diffusion region; and replacing the dummy gates other than the dummy gate in the single diffusion region with metal gates.

9 Claims, 5 Drawing Sheets

METHOD FOR MANUFACTURING FIN FIELD-EFFECT TRANSISTOR

CROSS-REFERENCES TO RELATED APPLICATIONS

This application claims the priority to Chinese patent application No. CN 202010531165.7, filed on Jun. 11, 2020 at CNIPA, and entitled "METHOD FOR MANUFACTURING FIN FIELD-EFFECT TRANSISTOR", the disclosure of which is incorporated herein by reference in entirety.

TECHNICAL FIELD

The present application relates to the field of semiconductor chip manufacturing, in particular to a method for manufacturing a fin field-effect transistor (FinFET).

BACKGROUND

With the continuous development of semiconductor integrated circuit technologies, the size of complementary metal oxide semiconductor (CMOS) devices has shrank continuously. As CMOS devices are scaled down, the line widths of transistor gates are reduced along the way, charge leakage occurs more easily at the transistor's source and drain, thus it has become more difficult to increase the saturation current of the CMOS device. The advanced three-dimensional fin field-effect transistor (FinFET) has been developed to replace the two-dimensional planar type CMOS device recently.

The fin field-effect transistor is a novel complementary metal oxide semiconductor transistor. One of the main features of the FinFET is the fin-shaped semiconductor channel region wrapped by the gate. The length of the fin along the source-drain direction is the length of the channel. The structure wrapped by the gate enhances the control ability of the gate and provides better electrical control of the channel. Compared with conventional planar transistors, the fin field-effect transistor has the following advantages:

(1) Generally, the channel of the fin field effect transistor is lightly doped or even undoped, avoiding the scattering effect of doping atoms. Compared with that of the heavily doped planar devices, the carrier mobility is greatly improved.

(2) Compared with the conventional planar CMOS, the fin field-effect transistor device has absolute advantages in suppressing sub-threshold current and gate leakage current. The fin structure such as double-gate or gate-semi-around of the fin field-effect transistor increases the control area of the gate on the channel, greatly enhancing the gate control ability, and thereby effectively suppressing the short channel effect and reducing the sub-threshold leakage current.

(3) Because of the suppression on the short channel effect and the enhancement of the gate control ability, a gate oxide layer thicker than that of the conventional transistors can be used in the fin field-effect transistor device, so that the gate leakage current is reduced.

(4) Because the process of the fin field-effect transistor is similar to the CMOS technology, the fin field-effect transistor is relatively compatible to be implemented in technology.

Because of the obvious advantages stated above, fin field-effect transistors have been adopted by leading chip manufacturers. In order to increase the density of devices in the FinFET process with existing techniques, many single diffusion breaks (SDBs) are applied to form narrower shallow trench isolation, so as to save the occupied areas of the gate arrays.

Generally, single diffusion breaks are formed before fins are finished, but such mode is likely to cause the following problems:

(1) The etching process is difficult, and the risk of charge leakage at source and drain of CMOS devices becomes higher.

(2) The large aspect ratio of depth-to-width may deteriorate trench filling performance.

(3) It is necessary to cover a relatively large dummy gate to avoid a high leakage current produced in the subsequent processes, but a relatively large dummy gate may deteriorate the contact performance between the metal gate and the metal layer.

(4) A corner of the epitaxial surface of the source and drain is missing from the extremely asymmetric epitaxial surface from the process, thus the epitaxial surface is far from ideal.

(5) The problems such as contact and penetration may occur at the edge of the ns.

The above problems affect the performance of the FinFET device. To solve the above problems, a method for manufacturing a fin field-effect transistor is needed to improve the manufacturing sequence of the single diffusion breaks during the FinFET fabrication process.

BRIEF SUMMARY

A brief overview of one or more embodiments is provided below to provide a basic understanding of these embodiments. The overview is not a detailed and comprehensive overview of all the conceived embodiments, and is neither intended to identify the key or decisive elements of all the embodiments, nor is it attempt to define the scope of any or all of the embodiments. The sole purpose is to present some concepts of one or more embodiments in a simplified form as a prelude to the more detailed description provided subsequently.

An embodiment of the present application provides a method for manufacturing a fin field-effect transistor, comprising steps of: forming a plurality of strip fins on a substrate; forming a plurality of dummy gates, wherein side walls are formed on both sides of each of the plurality of dummy gate, wherein the plurality of dummy gates comprises a first type of dummy gates placed in a single diffusion region, and a second type of dummy gates placed outside the single diffusion region; forming a source and a drain on the plurality of strip fins; depositing an interlayer dielectric layer, and performing chemical mechanical planarization (CMP) on the interlayer dielectric layer to expose a top of one of the plurality of dummy gates; replacing each of the first type of dummy gates to form a single diffusion break in the single diffusion region; and replacing each of the second type of dummy gates with a metal gate.

In some examples, replacing each of the first type of dummy gates to form the single diffusion break in the single diffusion region comprises steps of: forming a single diffusion region trench by etching the first type of dummy gates in the single diffusion region and the silicon substrate under the first type of dummy gates; depositing a filling material layer in the single diffusion region trench to form the single diffusion break; and performing chemical mechanical planarization on the filling material layer to expose the interlayer dielectric layer, wherein the filling material layer is flush with the interlayer dielectric layer.

In some examples, before forming the single diffusion region trench, forming a single diffusion region mask comprising an opening aligned to one of the first type of dummy gates in the single diffusion region; and after forming the single diffusion region trench, removing the single diffusion region mask.

In some examples, the single diffusion region mask is a photoresist or a hard mask.

In some examples, forming a single diffusion region trench comprises steps of: etching the first type of dummy gates in the single diffusion region; and etching the silicon substrate under the first type of dummy gates in the single diffusion region to a preset depth to form the single diffusion region trench.

In some examples, wherein removing the first type of dummy gates in the single diffusion region comprises dry etching or wet etching process; and wherein etching the silicon substrate under the first type of dummy gates in the single diffusion region to the preset depth comprises dry etching.

In some examples, the preset depth is determined by a required depth of the single diffusion break.

In some examples, the depth of the single diffusion break is in the range of 300-2000 Angstroms.

In some examples, the filling material layer is a silicon nitride or a silicon oxide.

In some examples, replacing each of the second type of dummy gates with the metal gate comprises a metal gate replacement process.

Figure 1:
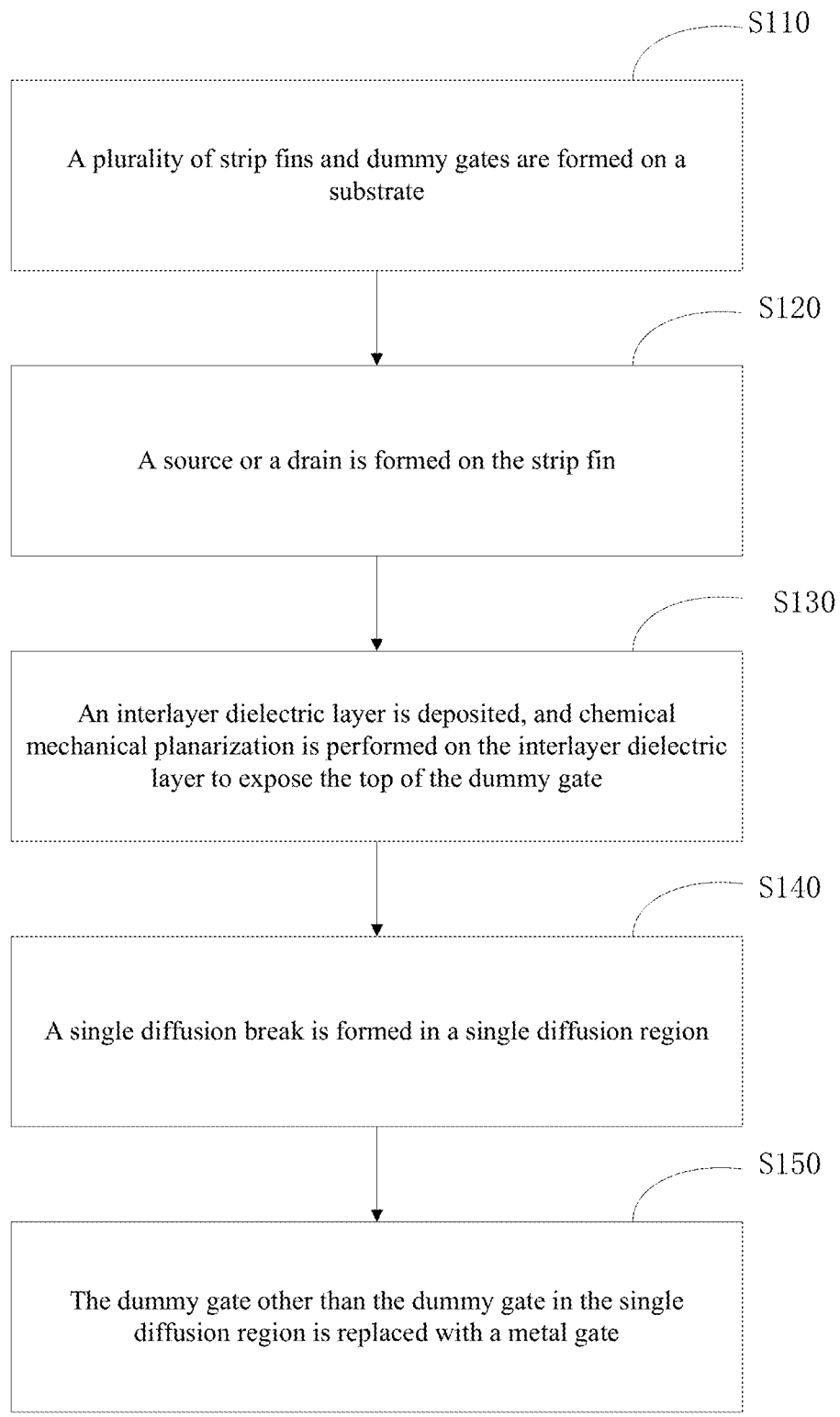
FIG. 1 is a schematic flowchart of a method for manufacturing a fin field-effect transistor according to an embodiment of the present disclosure.

For clarity, the brief description of the reference numerals is provided below:
S110-S150: Steps in the method of making FinFET device
101: Substrate
102: Strip fin
103: Dummy gate
1031: Dummy gate in the single diffusion region
104: Side wall
105: Source or drain
106: Interlayer dielectric layer
107: Single diffusion region cover
108: Single diffusion region trench
109: Single diffusion break

DETAILED DESCRIPTION OF THE DISCLOSURE

The following description is provided to enable those skilled in the art to implement and use the present application and incorporate it into specific application contexts. Various modifications and various uses in different applications are apparent to those skilled in the art, and the general principles defined herein can be applied to a wide range of embodiments. Therefore, the present application is not limited to the embodiments provided herein, but should be granted the broadest scope consistent with the principles and novel features disclosed herein.

In the following detailed description, many specific details are set forth to provide a more thorough understanding of the present application. However, it is obvious to those skilled in the art that the practice of the present application may not necessarily be limited to these specific details. In other words, the well-known structures and devices are shown in block diagram forms and are not shown in detail, so as to avoid obscuring the present application.

Readers should be noted that all files and documents submitted with this specification and open to the public to consult this specification, and the contents of all of the files and documents are incorporated herein by reference. Unless otherwise stated directly, all the features disclosed in this specification (including any appended claims, abstract, and drawings) can be replaced by alternative features for achieving the same, equivalent, or similar purpose. Therefore, unless otherwise stated expressly, each feature disclosed is only an example of a set of equivalent or similar features.

Moreover, any component of a device for performing a specific function or of a step for performing a specific function that is not expressly indicated in the claims should not be construed as a device or step clause as specified in Chapter 112, paragraph 6, of 35 USC. In particular, the use of "step for . . . " or "action for . . . " in the claims herein does not mean that the provision in paragraph 6 of 35 USC § 112 is involved.

It should be noted that when used, the left, right, front, rear, top, bottom, head, tail, clockwise, and counterclockwise signs are used for convenience only, and do not imply any specific direction. In fact, they are used to reflect the relative position and/or orientation between various parts of an object. In addition, the terms "first" and "second" are used for descriptive purposes only, and cannot be construed as indicating or implying relative importance.

In the description of the present application, it should be noted that, unless otherwise specified and defined clearly, the terms "mounting", "coupling", and "connecting" should be understood in a broad sense, for example, a connection can be a fixed connection, a detachable connection, or an integrated connection, can be a mechanical connection or an electrical connection, can be a direct connection, an indirect connection implemented by means of an intermedium, or an internal connection between two components. Those skilled in the art could understand the specific meanings of the above terms in the present application on the basis of specific situations.

It should be noted that when used, the terms "further", "in some examples", "furthermore", and "in some other examples" are simple beginnings for description of another embodiment on the basis of the foregoing embodiment, and a combination of the content following the terms "further", "in some examples", "furthermore", and "in some other examples" and the foregoing embodiment serves as complete composition of another embodiment. Configurations following a plurality of terms "further", "in some examples", "furthermore", and "in some other examples" in the same embodiment can be combined randomly to form yet another embodiment.

The present application is described in detail below with reference to the drawings and specific embodiments. It should be noted that various embodiments described with reference to the drawings and specific embodiments are used as examples only, and should not be construed as any limitation on the protection scope of the present application.

According to one embodiment of the present application, a method for manufacturing fin field-effect transistors is provided, to improve a process step of forming a single diffusion break, thereby solving the problem of performance deterioration of CMOS devices caused by an existing single diffusion break formation stage. Since there is no need to expand the critical dimension (CD) of a dummy gate, the contact performance between a metal gate and a metal layer is improved.

In an embodiment, referring to FIG. 1, the method for manufacturing a fin field-effect transistor includes steps S110-S150.

Step S110: a plurality of strip fins and dummy gates are formed on a substrate, wherein the dummy gates each has side walls formed on both sides.

Figure 2:
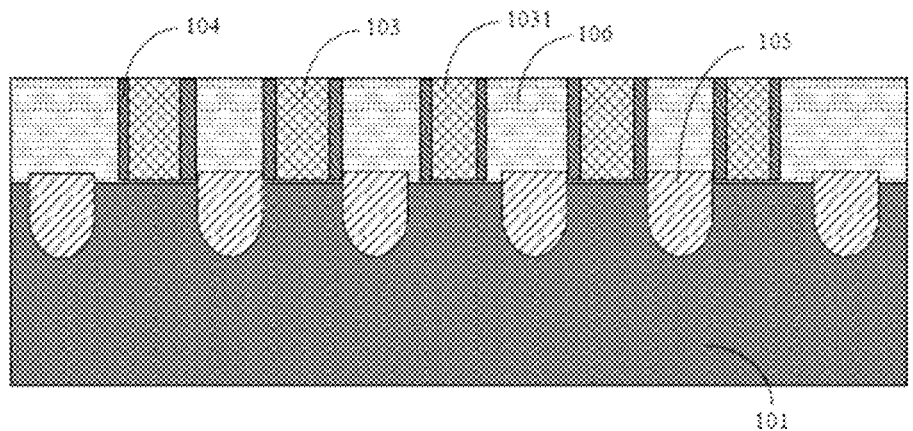
FIG. 2 is a schematic cross sectional view of a FinFET device structure at a process stage according to an embodiment of the present disclosure.
Figure 6:
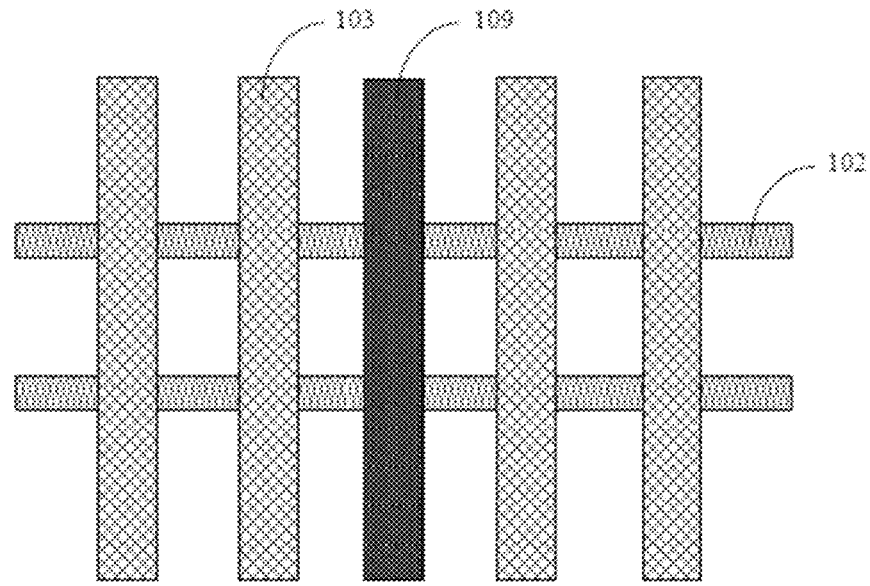
FIG. 6 is a schematic top view of the FinFET device structure according to an embodiment of the present application.

FIG. 2 is a schematic cross sectional view of the FinFET structure, and FIG. 6 is a schematic top view of the FinFET structure.

Specifically, referring to FIGS. 1, 2, and 6, step S110 may include first providing the substrate 101. The substrate 101 may be a silicon substrate. Further, a plurality of strip fins 102 (in FIG. 6) are first formed on the substrate 101, and then a plurality of dummy gates 103 are formed, wherein the side walls 104 are formed on both sides of the dummy gate 103.

Generally, the plurality of strip fins 102 are built parallel to each other and the plurality of dummy gates 103 are also built parallel to each other. The plurality of dummy gates 103 are disposed above and perpendicular to the plurality of strip fins 102, the plurality of dummy gates 103 and the plurality of strip fins 102 intersect. Referring to FIG. 6, the plurality of strip fins 102 and the plurality of dummy gates 103 are both built on the substrate 101 (shown in FIG. 2).

The dummy gates 103 may include a polysilicon gate and a temporary gate oxide layer.

Formation of the plurality of strip fins 102 and the plurality of dummy gates 103 may be implemented by applying the disclosed or future fin and dummy gate formation methods, thus is not limited to the described formation sequence or formation method.

Step S120: a source and a drain are formed on the plurality of strip fins 102.

Referring to FIG. 2, a source and a drain 105 regions are prepared, by means of photolithography process and ion implantation process, in a portion of each of the plurality of strip fins 102 not covered by the dummy gates 103.

In some examples, the source or the drain regions are formed on the strip fins with an epitaxial layer deposited by means of a self-alignment process.

Step S130: an interlayer dielectric layer is deposited, followed by chemical mechanical planarization (CMP) performed on the interlayer dielectric layer to expose the tops of the dummy gates.

Referring to FIG. 2, the interlayer dielectric (ILD) layer 106 is deposited on the surface of the substrate 101, CMP is performed on the interlayer dielectric layer 106, and the CMP stops when the tops of the dummy gates 103 are exposed.

Step S140: a single diffusion break is formed in a single diffusion region.

The single diffusion region refers to a region of the dummy gates where a single diffusion break needs to be formed.

In the current technique, there is a step of forming a single diffusion break by using a metal gate. That is, after an interlayer dielectric layer is formed, a dummy gate is first replaced with a metal gate, and then the single diffusion break is formed on the basis of the metal gate. It is understood that by replacing of the dummy gate with a metal gate, the dummy gate in the single diffusion region is also replaced, resulting in a process resource waste. In addition, the removal of the dummy gate causes the critical dimension of the dummy gate region to increase, thereby deteriorating the contact performance between the metal gate and a metal layer.

In the present application, the single diffusion break is made after the CMP performed on the interlayer dielectric layer and before replacing of the dummy gate, so to avoid the problem of corner missing and asymmetry of the epitaxial surface in the source and drain regions as the result of the single diffusion break formed prior to making the source and drain, and also avoided the contact performance deterioration between the metal gate and the metal layer from dummy gate expansion, thereby achieving better device performance and higher yield.

Step S150: replacing all dummy gates except those located in the single diffusion region with metal gates.

The dummy gates can be replaced with the metal gates by means of a compatible metal gate replacement process. Specifically, the polysilicon gates and the temporary gate oxide layer of the dummy gates are first removed by means of a photolithography and etching process, so a trench is formed, while the side walls on both sides of each dummy gate are retained; and then an interface oxide layer, a high-k dielectric layer, and a metal layer are sequentially deposited in the trench to form the metal gate. Other techniques can also be applied to realize the dummy gate replacement by a metal gate.

More specifically, the dummy gate 1031 in FIG. 2 is in a preset single diffusion region where a single diffusion break needs to be formed, the dummy gate 1031 is taken as an example to briefly describe a specific process of step S140 for forming the single diffusion break.

Figure 7:
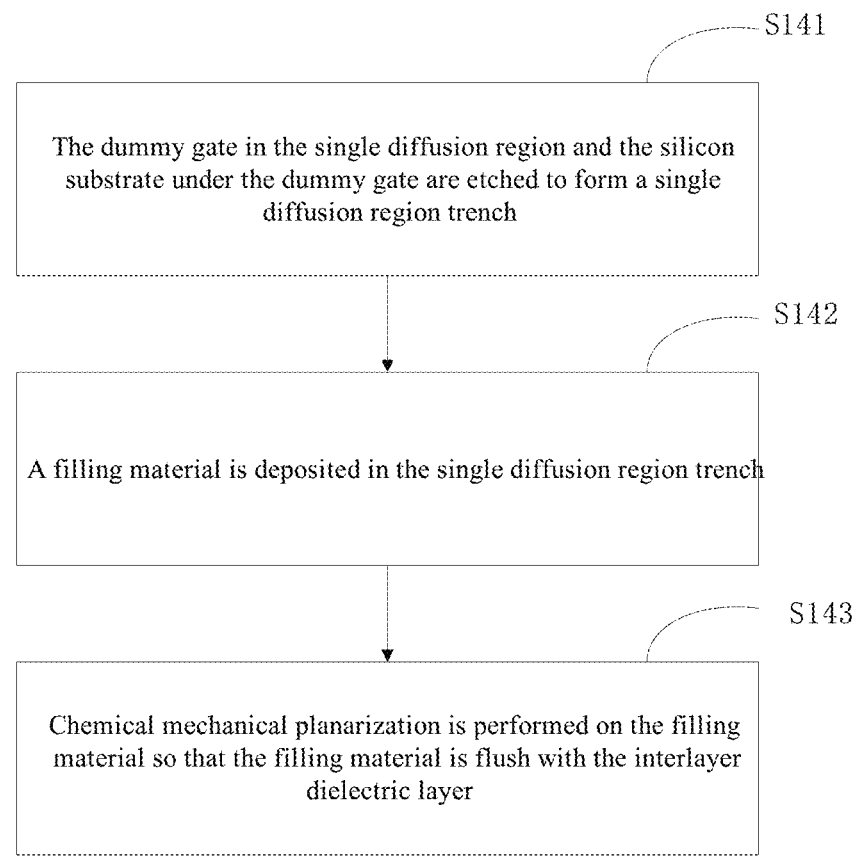
FIG. 7 is a schematic partial flowchart of the method for manufacturing the FinFET according to an embodiment of the present disclosure.

Referring to FIG. 7. step S140 may specifically include steps S141-S143.

Step S141: the dummy gate in the single diffusion region and the silicon substrate under this dummy gate are etched to form a single diffusion region trench.

Figure 8:
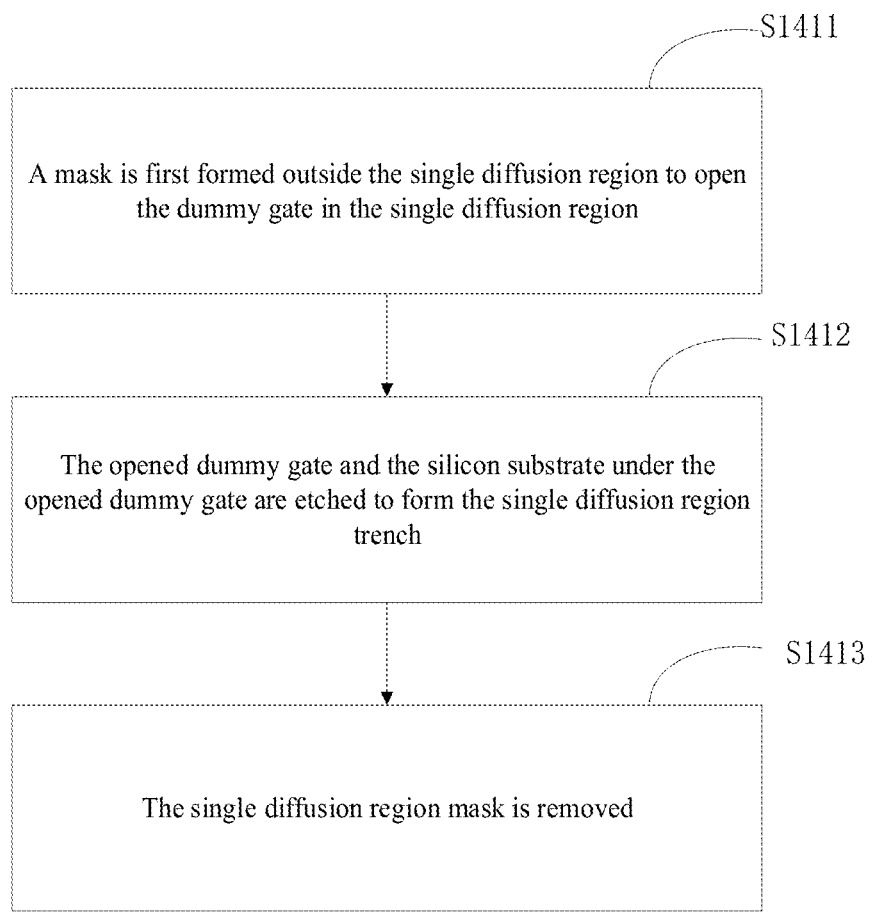
FIG. 8 is a schematic partial flowchart of the method for manufacturing a fin field-effect transistor according to an embodiment of the present disclosure.

In order to accurately etch the dummy gate in the single diffusion region, a mask is first formed outside the single diffusion region. In a specific embodiment, referring to FIG. 8, step S141 may include steps S1411-S1413.

Step S1411: a single diffusion region mask is formed in a region outside the single diffusion region to open the dummy gate in the single diffusion region.

The mask is a material that does not react with an etching material, and thus can prevent the region outside the single diffusion region from being etched. Since single diffusion region is not masked, the etching process is only performed on the dummy gate in the single diffusion region.

Figure 3:
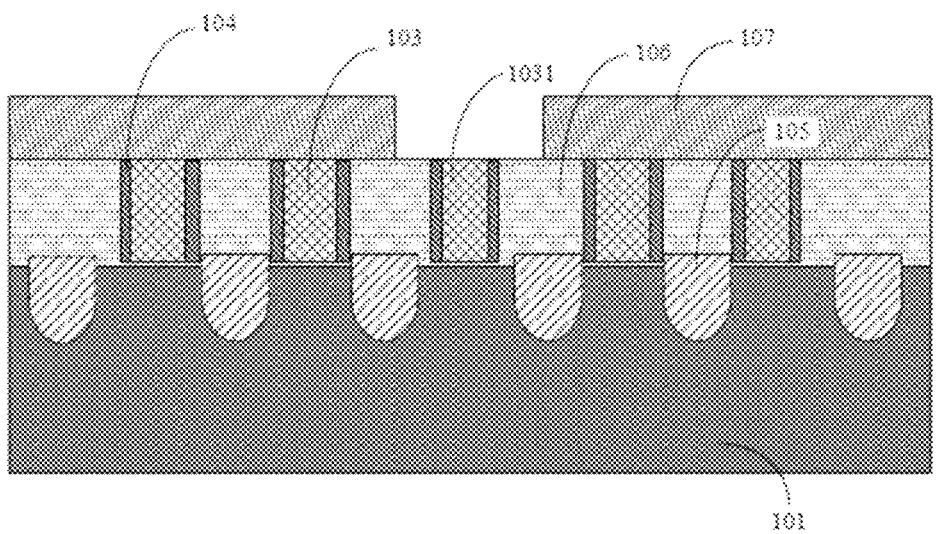
FIG. 3 is a schematic cross sectional of the FinFET device structure at a process stage according to an embodiment of the present disclosure.

Specifically, referring to FIG. 3, the single diffusion region mask 107 can be a photoresist or a hard mask which protects the outside areas from being etched. A specific formation process of the mask is compatible with other processes and will be just briefly described as an example in which a hard mask is used for the protection.

A hard mask (HM) can be first generated on the substrate 101, and the hard mask can be made of SiN, SiO, SiNO, or other appropriate materials. Secondly, a photoresist material is spin-coated on a hard mask layer, and a patterned photoresist layer is used as a mask to pattern the hard mask layer, so as to open the single diffusion region, i.e., the dummy gate 1031.

Step S1412: the opened dummy gate and the silicon substrate under the opened dummy gate are etched to form the single diffusion region trench.

The dummy gate 1031 and the silicon substrate 101 under the dummy gate 1031 are etched by using the mask 107. In some example, the side walls 104 on both sides of the dummy gate 1031 are retained.

Figure 4:
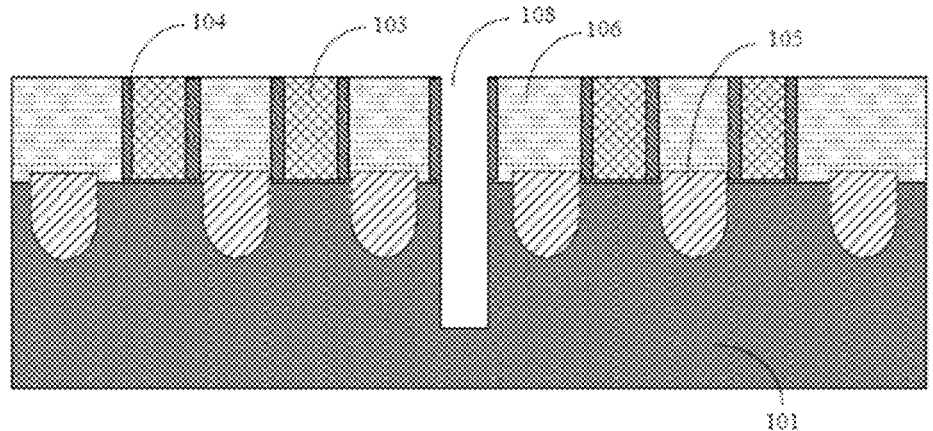
FIG. 4 is a schematic cross sectional of the FinFET device structure at a process stage according to an embodiment of the present disclosure.

Furthermore, the dummy gate 1031 and the silicon substrate under the dummy gate 1031 can be removed by means of different etching processes. Specifically, referring to FIG. 4, the dummy gate 1031 in the single diffusion region may be etched and removed first, and then the silicon substrate under the dummy gate 1031 may be etched to a preset depth, so as to form the single diffusion region trench 108.

The etching depth of the silicon substrate under the dummy gate 1031, i.e., the preset depth, can be configured on the basis of the depth required by the single diffusion break.

In some examples, the depth of the single diffusion break is in the range of 300-2000 Angstroms.

Optionally, the dummy gate 1031 can be removed by means of a dry etching or wet etching process.

Optionally, the silicon substrate under the dummy gate in the single diffusion region can be removed by means of dry etching.

Step S1413: the single diffusion region cover is removed.

Before deposition of the filling material, the photoresist or hard mask formed on the surface of the substrate in step S1411, i.e., the single diffusion region cover 107 shown in FIG. 3, is removed.

Step S142: after the single diffusion region trench 108 is formed, a filling material is deposited in the single diffusion region trench to fill up the single diffusion region trench.

The filling material can be a material the same as the interlayer dielectric layer. In some examples, the filling material is a silicon nitride or a silicon oxide.

Step S143: chemical mechanical planarization is performed on the filling material so that the filling material is flush with the interlayer dielectric layer to form the single diffusion break.

Figure 5:
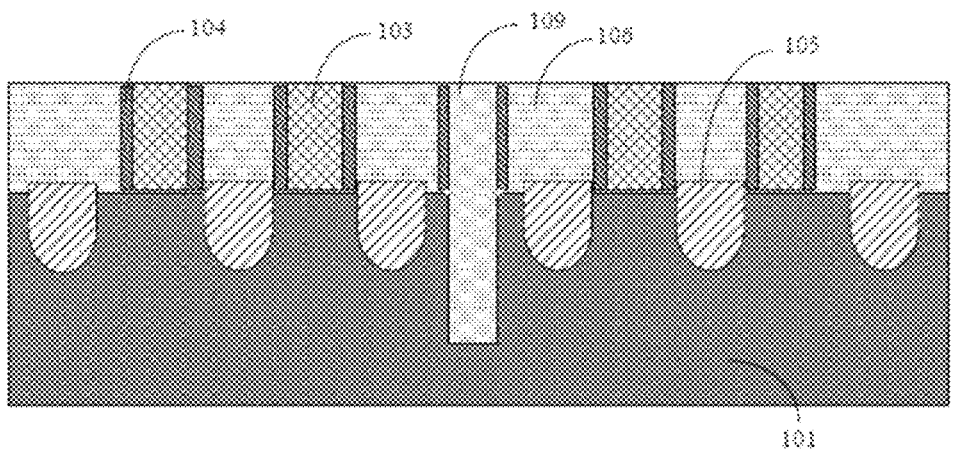
FIG. 5 is a schematic cross sectional of the FinFET device structure at a process stage according to an embodiment of the present disclosure.

Referring to in FIG. 5 or FIG. 6, after the filling material is deposited, CMP is performed on the filling material, and the CMP stops when the interlayer dielectric layer 106 is exposed, to complete the production of the single diffusion break 109.

Although the above methods are illustrated and described as a series of actions to simplify the explanation, it should be understood and appreciated that these methods are not limited by the order of the actions, because according to one or more embodiments, some actions may occur in a different order and/or occur concurrently with other actions illustrated and described herein or actions that are not illustrated or described herein but can be understood by those skilled in the art.

The advantages of the method for manufacturing a fin field-effect transistor of the present application are as follows:

(1) Since there is no requirement to increase the critical dimension of the dummy gate, the contact performance between the metal gate and the metal layer is improved.

(2) High-quality source and drain regions can be formed.

(3) The deterioration of trench filling performance is reduced.

(4) There is no more asymmetric growth of the epitaxial surface of the fin region.

(5) The contact and penetration problem on the edge of the fins is avoided.

The above description is provided to enable any person skilled in the art to practice various embodiments described herein. However, it should be understood that the protection scope of the present application should be subject to the appended claims but should not be limited to the specific structures and components in the embodiments explained above. Those skilled in the art could make various changes and modifications to the embodiments within the spirit and scope of the present application, and these changes and modifications also fall within the protection scope of the present application.

What is claimed is:

1. A method for manufacturing a fin field-effect transistor, comprising steps of:
   forming a plurality of strip fins on a substrate;
   forming a plurality of dummy gates, wherein side walls are formed on both sides of each of the plurality of dummy gate, wherein the plurality of dummy gates comprises a first type of dummy gates placed in a single diffusion region, and a second type of dummy gates placed outside the single diffusion region;
   forming a source and a drain on the plurality of strip fins;
       depositing an interlayer dielectric layer between any two adjacent ones of the plurality of dummy gates, and performing chemical mechanical planarization (CMP) on the interlayer dielectric layer to expose a top of one of the plurality of dummy gates;
   forming a patterned mask to expose each of the first type of dummy gates;
       etching by the patterned mask to form a first portion of a single diffusion trench, wherein the side walls of each of the first type of dummy gates are retained during the etching, removing the first portion, followed by extending etching into the substrate to form a second portion of the single diffusion trench, wherein the first portion of the single diffusion trench is above a top surface of the substrate and the second portion is in the substrate, wherein the first portion of the single diffusion trench is on top of the second portion, wherein the first portion the substrate is located within the side walls in one of the first type of dummy gates, and wherein the second portion in the substrate is located under the first type of dummy gate, wherein the second portion contacts directly with the substrate without side walls;
   and wherein a depth of the single diffusion trench is predetermined;
       depositing a filling material layer in the single diffusion trench to form a single diffusion break;
       performing chemical mechanical planarization on the filling material layer to expose the interlayer dielectric layer, wherein a top surface of the filling material layer is flush with the interlayer dielectric layer after the chemical mechanical planarization, wherein the filling material and a material of the interlayer dielectric layer are a same; and replacing each of the second type of dummy gates with a metal gate.

2. The manufacturing method according to claim 1, further comprising steps of:

before forming the single diffusion region trench, forming the patterned mask comprising forming an opening aligned to one of the first type of dummy gates in the single diffusion region; and after forming the single diffusion region trench, removing the single diffusion region mask.

3. The manufacturing method according to claim 2, wherein the single diffusion region mask is a photoresist or a hard mask.

4. The manufacturing method according to claim 1, wherein forming a single diffusion region trench comprises steps of:

etching the first type of dummy gates in the single diffusion region; and etching the silicon substrate under the first type of dummy gates in the single diffusion region to a preset depth to form the single diffusion region trench.

5. The manufacturing method according to claim 4, wherein removing the first type of dummy gates in the single diffusion region comprises dry etching or wet etching process; and wherein etching the silicon substrate under the first type of dummy gates in the single diffusion region to the preset depth comprises dry etching.

6. The manufacturing method according to claim 4, wherein the preset depth is determined by a required depth of the single diffusion break.

7. The manufacturing method according to claim 6, wherein the required depth of the single diffusion break is in a range of 300-2000 Angstroms.

8. The manufacturing method according to claim 1, wherein the filling material layer is a silicon nitride or a silicon oxide.

9. The manufacturing method according to claim 1, wherein replacing each of the second type of dummy gates with the metal gate comprises a metal gate replacement process.

* * * * *